United States Patent [19]

Katsumata et al.

[11] Patent Number: 4,933,260
[45] Date of Patent: Jun. 12, 1990

[54] WATER BASED PHOTOPOLYMERIZABLE RESIN COMPOSITION

[75] Inventors: Naoya Katsumata, Samukawa; Syunzi Nakazato, Sagamihara; Katsuyuki Ohta, Atsugi; Toshimi Aoyama, Fujisawa, all of Japan

[73] Assignee: Tokyo Ohka Kogyo Co., Ltd., Kanagawa, Japan

[21] Appl. No.: 401,081

[22] Filed: Aug. 31, 1989

[30] Foreign Application Priority Data

Sep. 8, 1988 [JP] Japan .................. 63-223564

[51] Int. Cl.$^5$ ................................ G03C 1/70
[52] U.S. Cl. ..................... 430/283; 430/909; 522/116; 522/40; 522/48; 522/68
[58] Field of Search ............. 430/283, 909; 522/116, 522/40, 48, 68

[56] References Cited

U.S. PATENT DOCUMENTS 3,801,328  4/1974  Takimoto et al. ............. 430/288 X
3,897,295  7/1975  Dowbenko et al. ............ 522/116 X
4,572,887  2/1986  Geissler ....................... 522/116 X Primary Examiner—Paul R. Michl
Assistant Examiner—Cynthia Hamilton
Attorney, Agent, or Firm—Wyatt, Gerber, Burke and Badie

[57] ABSTRACT

A water-based photopolymerizable resin composition is disclosed which is suitable for the preparation of a relief printing plate by the photolithographic techniques. The inventive composition, which basically comprises a water-soluble polymer, e.g., poly(vinyl alcohol), a photopolymerizable monomer and a photopolymerization initiator, is characterized in that at least a part of the photopolymerizable monomer is N-tetrahydrofurfuryloxymethyl acrylamide or N-tetrahydrofurfuryloxymethyl methacrylamide. By virtue of this unique ingredient in the composition, the printing plate prepared from the inventive composition is imparted with improved fidelity of pattern reproduction and durability in printing as a consequence of increased hardness and pliability to be freed from the drawback of crack formation in printing even on a cylinder of small diameter under a cold and low-humidity condition.

4 Claims, No Drawings

WATER BASED PHOTOPOLYMERIZABLE RESIN COMPOSITION

BACKGROUND OF THE INVENTION

The present invention relates to a water-based photopolymerizable resin composition. More Particularly, the invention relates to a water-based photopolymerizable resin composition which can be used in the preparation of a photosensitive resinous printing plate having excellent pliability and durability in printing and free from the problem of crack formation even when the printing plate is used on a printing press with a cylinder of small diameter under a cold and low-humidity condition.

Known photosensitive resin compositions in the prior art used for the preparation of relief printing plates are classified depending on the solubility behavior into those soluble in an aqueous alkaline solution, those soluble in an organic solvent such as alcohol and those soluble in neutral water. As a trend in recent years, the last mentioned water-soluble ones are used increasingly in view of the advantages in the safety of processing works with the same, absence of the problem on the workers' health and absence of the problems relative to the waste disposal.

Several different types of water-soluble photosensitive resin compositions are known for use in the preparation of printing plates including those containing a poly(vinyl alcohol), an acrylamide compound and a photosensitizer disclosed in Japanese Patent Publication 39-25941, those containing a graft-copolymerized poly(vinyl alcohol) and a photosensitizer disclosed in Japanese Patent Publication 44-28275, those containing a poly(vinyl alcohol) esterified with an unsaturated carboxylic acid as the photosensitizing ingredient disclosed in Japanese Patent Publication 48-6962, those containing a combination of a poly(vinyl alcohol) and a diazonium salt or tetrazonium salt as the photosensitizing ingredient or those containing a combination of a poly(vinyl alcohol) and an acrylate compound such as 2-hydroxyethyl methacrylate disclosed in U.S. Patent No. 3,801,328, and so on.

These prior art water-based photosensitive resin compositions in general, of which the characteristic ingredients are a poly(vinyl alcohol) and a constituent having a photoreactive group, have disadvantages of low developability in patterning, poor versatility of the starting materials to satisfy specific requirements for the properties and difficulty in the purification of the photosensitive constituents although the printing plates prepared therefrom have good resistance against water and chemicals and adequately high hardness. Since poly(vinyl alcohols) or derivatives thereof and unsaturated compounds conventionally used as a photosensitive ingredient are poorly compatible with each other, printing plates having sufficiently high hardness and water-resistance can be obtained with difficulties and cracks are sometimes formed in the printing plates prepared using the composition, especially, under a cold and low-humidity condition.

Alternatively, Japanese Patent Publication 53-2082 proposes a water-based photosensitive resin composition comprising a water soluble nylon resin and a photosensitizing agent. This composition, however, is not practical because, in addition to the poor compatibility of the water-soluble nylon resin and the photosensitizing agent, an insoluble matter is sometimes precipitated in the depleted developer solution and the precipitates must be dissolved away by adding an acid such as acetic acid to the solution in order to prevent cloqqinq in the pipe lines.

With an object to solve the above mentioned problems in the water-soluble photosensitive resin compositions in the prior art, the inventors have previously proposed a water-soluble photosensitive resin composition comprising a poly(vinyl alcohol) and a polycondensate having compatibility therewith, such as a polycondensate of an alkylol urea and an N-alkylol acrylamide or a polycondensate of urea and formaldehyde modified by the addition-condensation of an N-alkylol acrylamide (see Japanese Patent Publication 54-3790). Although the Printing Plate Prepared from this composition is excellent in general properties, a problem thereof is that the relief prepared by plate making is sometimes too hard and subject to crack formation so that improvement in this regard is eagerly desired.

The inventors further proposed, in Japanese Patent Kokai 60-101531, a photosensitive resin composition comprising a water-soluble resin, photopolymerization initiator and reaction product of a polyglycerin and a photopolymerizable ethylenically unsaturated compound. Although the problem of crack formation in the printing plate prepared therefrom can be solved to a considerable extent, the improvement is still insufficient so that crack formation in the printing plates cannot be completely prevented especially when the printing plate is used on a printing press having a small-diameter cylinder such as a label printing machine.

SUMMARY OF THE INVENTION

The present invention accordingly has an object to provide a novel water-based photopolymerizable resin composition capable of giving a resinous relief printing plate having high pliability and durability in printing and freed from the defects of crack formation in the prior art resinous printing plates even when the printing plate is used under a cold and low-humidity condition or on a printing press having a cylinder of small diameter.

Thus, the water-based photopolymerizable resin composition of the present invention comprises, as dissolved in water as a solvent:

(a) 100 parts by weight of a water-soluble polymer;

(b) from 10 to 150 parts by weight of a photopolymerizable monomer comprising at least 3 parts by weight of N-tetrahydrofurfuryloxymethyl acrylamide, N-tetrahydrofurfuryloxymethyl methacrylamide or a combination thereof, the balance, if any, being a photopolymerizable monomer other than N-tetrahydrofurfuryloxymethyl acrylamide and N-tetrahydrofurfuryloxymethyl methacrylamide; and (c) from 0.1 to 10 parts by weight of a photopolymerization initiator.

DETAILED DESCRIPTION OF THE PREFERRED EMBODIMENTS

As is described above, the most characteristic ingredient in the inventive water-based photopolymerizable resin composition is the component (b) which comprises at least a substantial amount of the specific tetrahydrofurfuryloxy-containing ethylenically unsaturated compound.

The component (a) in the inventive composition is a water-soluble polymeric compound which is exemplified by poly(vinyl alcohol) and derivatives thereof, poly(vinyl ethers), water soluble cellulose ethers such as carboxymethyl cellulose, hydroxyethyl cellulose and hydroxypropyl cellulose, water-soluble alkyd resins, poly(ethylene oxides), poly(vinyl pyrrolidones), poly(acrylic acid) and sodium salt thereof, water-soluble nylon resins having a sulfonate group in the molecule, copolymers of maleic acid and the like. These water soluble polymers can be used either singly or as a combination of two kinds or more according to need.

The component (b) in the inventive composition is one or a combination of two kinds or more of photopolymerizable monomers. It is essential that at least a part of the component (b) is N tetrahydrofurfuryloxymethyl acrylamide or N-tetrahydrofurfuryloxymethyl methacrylamide expressed by the structural formula

 (I)

in which R is a hydrogen atom or a methyl group corresponding to the acrylamide and methacrylamide, respectively. It is optional that N tetrahydrofurfuryloxymethyl acrylamide and N-tetrahydrofurfuryloxymethyl methacrylamide are used in combination in any desired proportion. These compounds can be easily synthesized by a known process from N-methylol acrylamide or N methylol methacrylamide and tetrahydrofurfuryl alcohol.

The above described specific photopolymerizable monomer or monomers of the formula (1) can be used alone as the component (b) but, if desired, these photopolymerizable monomers can be used in combination with other known photopolymerizable monomer or monomers. Examples of known photopolymerizable monomers to be combined with the compound of the formula (1) include acrylic acid, methacrylic acid, methyl acrylate, methyl methacrylate, ethyl acrylate, ethyl methacrylate, glycidyl acrylate, glycidyl methacrylate, N-methylol acrylamide, N methylol methacrylamide, N-ethylol acrylamide, N-ethylol methacrylamide, hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, acrylonitrile, methacrylonitrile, diethylene glycol diacrylate, diethylene glycol dimethacrylate, triethylene glycol diacrylate, triethylene glycol dimethacrylate, tetraethylene glycol diacrylate, tetraethylene glycol dimethacrylate, trimethylolpropane diacrylate, trimethylolpropane dimethacrylate, trimethylol propane triacrylate, trimethylolpropane trimethacrylate and the like. These photopolymerizable monomers can be used either singly or as a combination of two kinds or more according to need as combined with the monomer or monomers of the formula (I).

The amount of the component (b) as the photopolymerizable monomer or monomers in the inventive composition should be in the range from 10 to 150 parts by weight per 100 parts by weight of the water-soluble polymer as the component (a). When the amount thereof is too small, the photocurability of the composition by the photopolymerization of the component (b) is poor so that an unduly long exposure time is required in the photolithographic plate-making process and the printing plate prepared from the composition may have poor mechanical strengths. When the amount of the component (b) is too large, on the other hand, a problem may be caused in respect of the compatibility of the components (a) and (b) or the surface of the printing plate prepared from the composition may have stickiness. It is desirable that at least 30% by weight or, preferably, at least 50% by weight of the photopolymerizable monomer or monomers as the component (b) is the N-tetrahydrofurfuryloxymethyl acrylamide, N-tetrahydrofurfuryloxymethyl methacrylamide or a combination thereof. In other words, the amount of the compound expressed by the formula (1) in the inventive composition should be at least 3 parts by weight or, preferably, at least 5 parts by weight per 100 parts by weight of the water-soluble polymer as the component (a). When the amount thereof is too small, the printing plate prepared from the composition may be subject to the drawback of crack formation.

The component (c) is a photopolymerization initiator which can be any of known photopolymerization initiators conventionally used in photopolymerizable compositions. Examples of suitable photopolymerization initiators include benzophenone and derivatives thereof such as 2,4-dihydroxy benzophenone and 2 hydroxy-4-alkoxy benzophenones, benzoin and derivatives thereof such as benzoin isopropyl ether and benzoin methyl ether, anthraquinone and derivatives thereof such as 2-methyl anthraquinone and 2-ethyl anthraquinone and the like. These photopolymerization initiators can be used either singly or as a combination of two kinds or more according to need. The amount of the photopolymerization initiator as the component (c) in the inventive composition is usually in the range from 0.1 to 10 parts by weight per 100 parts by weight of the water-soluble polymer as the component (a).

It is optional that, in addition to the above described components (a), (b) and (c), the water-based photopolymerizable resin composition of the invention further contains various known additives conventionally used in photopolymerizable resin compositions including, for example, thermal polymerization inhibitors, plasticizers, coloring agents, i.e. dyes and pigments, and so on according to need.

The inventive water-based photopolymerizable resin composition prepared in the form of an aqueous solution by dissolving the components (a), (b), (c) and other optional ingredients in water can be used in the preparation of printing plates. In plate making, the aqueous solution is uniformly applied by a suitable coating method to the surface of a substrate plate such as aluminum plates, polyester sheets, copper plates, zinc plates, steel plates, chromium-plated plates, glass plates and the like either directly or, if necessary, after coating the substrate surface with a primer and dried to give a coating layer having a thickness in the range, for example, from 0.1 to 3.0 mm.

The above mentioned primer is used when good adhesion cannot be obtained directly between the substrate surface and the layer of the photopolymerizable resin composition formed thereon by coating with an object to improve the adhesion therebetween. Accordingly, the type of the primer depends on the combination of the substrate material and the coatinq layer thereon. For example, a solution of a polyester resin in an orqanic solvent can be used satisfactorily in most cases and the substrate coated with a primer solution is dried before coating with the water-based photopolymerizable resin composition of the invention.

The Process of Patterning of the plate to prepare a relief printing plate can be performed according to a conventional procedure by bringing a negative transparency into direct and intimate contact with the surface of the substrate plate and exposing the layer of the photopolymerizable resin composition patternwise to actinic rays such as ultraviolet light through the transparency so as to effect the photopolymerization of the composition on the patternwise exposed areas followed by a development treatment in which the composition on the unexposed areas is dissolved away with water optionally containing a surface active aqent.

In the following, examples are given to illustrate the inventive water-based photopolymerizable resin composition and the advantages obtained therewith in more detail but not to limit the scope of the invention in any way. In the following description, the term of "parts" always refers to "parts by weight".

EXAMPLE 1.

A water-based photopolymerizable resin composition was prepared by dissolving 100 parts of a poly(vinyl alcohol) having an average degree of polymerization of about 500 and a degree of saponification of 80%, 80 parts of N-tetrahydrofurfuryloxymethyl acrylamide, 2 parts of benzoin isopropyl ether and 0.05 part of methyl hydroquinone in 200 parts of water in a flask at 90° C. under agitation. A steel plate having a halation-preventing layer was coated with the thus prepared resin solution, which was poured on and allowed to drip from the substrate surface, followed by drying at 40° C. for 15 hours to form a uniform coating layer of the Photopolymerizable resin composition having a thickness of 0.7 mm as dried. The ingredients in the resin composition had good compatibility with each other so that the coating layer thus formed was very clear without cloudiness.

The coating layer on the steel plate was overlaid with a negative transparency of test pattern which was brought into direct and intimate contact with the coating layer by applying vacuum and the layer of the photopolymerizable resin composition was exposed to ultraviolet light through the transparency for 5 minutes at a distance of 2.4 cm from a chemical lamp (Model FL40BL, a product by Toshiba Corp.) followed by washing with hot water at 45° C. from a spraying wash-out machine at a pressure of 3.7 kg/cm$^2$ for 150 seconds to dissolve away the unpolymerized resin composition on the unexposed areas and then drying at 100° C. for 5 minutes. Finally, the thus obtained plate was post-exposed to ultraviolet light for 10 minutes under the same conditions as above.

The thus obtained relief printing plate gave a high-fidelity reproduction of the test pattern even in the highlight areas of 65 lines/inch and 2% mesh dots and in the isolated lines of 40 μm width. The Shore D hardness of the resin layer at the relief was 70°. The plate was further subjected to a bending test after heating at 100° C. for additional 5 hours to find that the resin layer was safe from cracks even by 180° bending of the Plate.

COMPARATIVE EXAMPLE 1.

The experimental procedure was substantially the same as in Example 1 excepting replacement of the N-tetrahydrofurfuryloxymethyl acrylamide with the same amount of a condensation product described below. Thus, the condensation product was prepared, according to the procedure described in Example 2 of Japanese Patent Publication 54-3790, by adding 74 parts of a dimethylol urea dimethyl ether, 202 parts of N-methylol acrylamide and 2 parts of ammonium chloride to an aqueous solution of 0.025 part of methyl hydroquinone in 10 parts of water to give a reaction mixture which was heated at 80° C. for 2 hours under agitation and pouring the mixture into 1000 parts of acetone followed by filtration of the solution to remove insoluble matter and evaporation of the filtrate to dryness to give a solid resin.

The results of the plate making test were that a good reproduction of the test pattern could be obtained even in the highlight areas of 65 lines/inch and 2% mesh dots and in the isolated lines of 40 μm width. The Shore D hardness of the resin layer at the relief was 75°. The plate was further subjected to a bending test after heating at 100° C. for additional 5 hours to find that cracks were formed in the resin layer when the plate was bent by 180°.

EXAMPLE 2.

A water-based photopolymerizable resin solution was prepared in about the same manner as in Example 1 by dissolving 50 parts of a first poly(vinyl alcohol) having an average degree of polymerization of about 1700 and a degree of saponification of 80%, 150 parts of a second poly(vinyl alcohol) having an average degree of polymerization of about 500 and a degree of saponification of 75%, 70 parts of N-tetrahydrofurfuryloxymethyl acrylamide, 20 parts of triethylene glycol diacrylate, 4 parts of benzoin isopropyl ether and 0.05 part of methyl hydroquinone in 200 parts of water. A polyester sheet was coated with this resin solution in the same manner as in Example 1 to give a coating layer of 0.7 mm thickness as dried which was very clear indicating good compatibility of the ingredients in the composition with each other.

The photopolymerizable resin layer on the substrate was exposed to ultraviolet light and washed with water in substantially the same manner as in Example 1 except that the wash-out machine used here was the brushing-type one (a product by Tokyo Ohka Kogyo Co.). The results were that no scratches by brushing were found on the surface and reproduction of the test pattern was complete even in the highlight areas of 65 lines/inch and 2% mesh dots and in the isolated lines of 40 μm width. The Shore D hardness of the relief was 60°.

This relief Printing Plate was mounted on a cylinder of 11 cm diameter and a printing test was conducted by continuously running a label printing machine to prepare 500,000 sheets of labels. The relief was absolutely free from cracks and exfoliation from the substrate surface.

COMPARATIVE EXAMPLE 2.

The experimental procedure was substantially the same as in Example 2 excepting replacement of the N-tetrahydrofurfuryloxymethyl acrylamide with the same amount of 2-hydroxyethyl methacrylate.

The result of the plate-making test was that the fidelity in the test pattern reproduction had a limitation in the highlight areas of 65 lines/inch and 5% mesh dots and in the isolated lines of 100 μm width. The result of the printing test undertaken with this printing plate in the same manner as in Example 2 was that cracks were formed in the relief layer after about 100,000 times of continued printing so that printing could no longer be continued.

EXAMPLE 3.

A water-based photopolymerizable resin composition was prepared in just the same formulationr as in Example 1 excepting replacement of the N-tetrahydrofurfuryloxymethyl acrylamide with the same amount of N-tetrahydrofurfuryloxymethyl methacrylamide.

The test of plate making using this composition were conducted in substantially the same manner as in Example 1 except that the patternwise exposure time of the plate was 7 minutes instead of 5 minutes.

The results of the plate making test were that a good reproduction of the test pattern could be obtained even in the highlight areas of 65 lines/inch and 2% mesh dots and in the isolated lines of 40 μm width. The Shore D hardness of the resin layer at the relief was 65°. The plate was further subjected to the bending test after heating at 100 ° C. for additional 5 hours to find that no cracks were formed in the resin layer when the plate was bent by 180°.

EXAMPLE 4.

A water-soluble polyamide was prepared by introducing 113 g of ε-caprolactam, 18.6 g of hexamethylene diamine, 40.2 g of sodium 3,5-dicarboxybenzene sulfonate and 66 g of ε-aminocaproic acid into an autoclave and heating the mixture in the autoclave after flushing with nitrogen gas at 250° C. for 5 hours. The thus obtained polyamide had a relative viscosity of 1.36 at 25° C. in a 1 g/100 ml solution in 96% sulfuric acid. An aqueous solution of a photopolymerizable composition was prepared by dissolving 50 g of this polyamide in 100 g of a 50:50 mixture of methyl alcohol and water together with 25 g of N-tetrahydrofurfuryloxymethyl acrylamide, 3 g of methacrylamide, 1 g of benzophenone and 0.03 g of methyl hydroquinone. A Printing plate was prepared by using this solution in the same manner as in Example 2.

The results of the plate making test were that a good reproduction of the test pattern could be obtained even in the highlight areas of 65 lines/inch and 2% mesh dots and in the isolated lines of 40 μm width. The Shore D hardness of the resin layer at the relief was 65°. The plate was further subjected to the bending test after heating at 100° C. for additional 5 hours to find that no cracks were formed in the resin layer when the plate was bent by 90°.

COMPARATIVE EXAMPLE 3.

A printing plate was prepared in the same manner as in Example 4 excepting replacement of the N-tetrahydrofurfuryloxymethyl acrylamide with the same amount of the condensation product of dimethylol urea dimethyl ether and N-methylol acrylamide used in Comparative Example 1.

The results of the plate making test were that a good reproduction of the test pattern could be obtained even in the highlight areas of 65 lines/inch and 2% mesh dots and in the isolated lines of 40 μm width. The Shore D hardness of the resin layer at the relief was 70°. The plate was further subjected to the bending test after heating at 100° C. for additional 5 hours to find that cracks were formed in the resin layer when the plate was bent by 90°.

What is claimed is:

1. A water-based photopolymerizable resin composition which comprises, as dissolved in water as a solvent:
    (a) 100 parts by weight of a water-soluble polymer;
    (b) from 10 to 150 parts by weight of a photopolymerizable monomer comprising at least 3 parts by weight of N-tetrahydrofurfuryloxymethyl acrylamide, N-tetrahydrofurfuryl oxymethyl methacrylamide or a combination thereof, the balance, if any, being a photopolymerizable monomer other than N-tetrahydrofurfuryloxymethyl acrylamide and N-tetrahydrofurfuryloxymethyl methacrylamide; and
    (c) from 0.1 to 10 parts by weight of a photopolymerization initiator.

2. The water-based photopolymerizable resin composition as claimed in claim 1 wherein the water-soluble polymer as the component (a) is a poly(vinyl alcohol).

3. The water-based photopolymerizable resin composition as claimed in claim 1 wherein at least 30% by weight of the component (b) is N-tetrahydrofurfuryloxymethyl acrylamide N-tetrahydrofurfuryloxymethyl methacrylamide or a combination thereof.

4. The water-based photopolymerizable resin composition as claimed in claim 1 wherein the photopolymerization initiator is selected from the group consisting of benzophenone and derivatives thereof, benzoin and derivatives thereof and anthraquinone and derivatives thereof.

* * * * *